United States Patent
Mori et al.

(10) Patent No.: US 6,303,873 B1
(45) Date of Patent: *Oct. 16, 2001

(54) ELECTRONIC PART MODULE AND PROCESS FOR MANUFACTURING THE SAME

(75) Inventors: Mikio Mori, Gifu-ken; Toshimi Kohmura, Tsukuba, both of (JP)

(73) Assignee: Ibiden Co., Ltd., Ogaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/065,099

(22) PCT Filed: Oct. 28, 1996

(86) PCT No.: PCT/JP96/03153

§ 371 Date: Apr. 29, 1998

§ 102(e) Date: Apr. 29, 1998

(87) PCT Pub. No.: WO97/16848

PCT Pub. Date: May 9, 1997

(30) Foreign Application Priority Data

Oct. 31, 1995 (JP) .................................................. 7-308327

(51) Int. Cl.[7] ..................................................... H05K 1/16
(52) U.S. Cl. ........................... 174/260; 174/255; 174/262
(58) Field of Search ............................. 174/260, 262, 174/265, 266, 255; 361/760, 764, 767, 777, 783; 257/777

(56) References Cited

U.S. PATENT DOCUMENTS 5,128,746 * 7/1992 Pennisi et al. ........................ 357/72
5,363,277 * 11/1994 Tanaka ................................. 361/760
5,426,266 * 6/1995 Brown et al. ......................... 174/267
5,686,763 * 11/1997 Tokuno et al. ....................... 257/777
5,768,109 * 6/1998 Gulick et al. ........................ 361/794
5,843,251 * 12/1998 Tsukagoshi et al. .................. 156/64
5,859,470 * 1/1999 Ellerson et al. ...................... 257/772
6,046,909 * 4/2000 Joy ...................................... 361/748
6,058,021 * 5/2000 Yamamoto ........................... 361/783

* cited by examiner

Primary Examiner—Jeffrey Gaffin
Assistant Examiner—Jeremy Norris
(74) Attorney, Agent, or Firm—Oblon, Spivak, McClelland, Maier & Neustadt, P.C.

(57) ABSTRACT

An inexpensive electronic part module and a process for manufacturing the same, wherein an inexpensive thermoplastic resin is used as the substrate of the circuit board. In order to electrically connect the solder bumps of an electronic part such as an IC chip to a connection pattern, without forming connection holes in the substrate, the substrate is melted and the solder bumps are passed through the substrate by pressing the electronic part against the substrate in a state that the electronic part is heated. The substrate itself can be utilized as an adhesive. The solder bumps 2 are passed through the substrate 4 and contacted with the connection pattern 5 by pressing the solder bumps 2 against the substrate 4 in a state that the electronic part 3 is heated to a temperature higher than the melting point of the thermoplastic resin and lower than the melting point of the solder bumps 2. Further, the solder bumps 2 are melted and connected to the connection pattern 5 while the electronic part 3 is heated to a temperature higher than the melting point of the solder bumps 2. Accordingly, the electronic part 3 can be bonded and fixed at the periphery of the solder bumps 2 through the thermoplastic resin of the substrate 4.

4 Claims, 5 Drawing Sheets

ELECTRONIC PART MODULE AND PROCESS FOR MANUFACTURING THE SAME

TECHNICAL FIELD

The present invention relates to an electronic part module and a process for manufacturing the same, for example, an IC chip module and the like suitable for use in an IC card wherein a bump formed on the electronic part, for example, an IC chip and the like, is connected to a connection pattern formed on a surface of a circuit board, and wherein the electronic part is bonded and fixed onto the circuit board. More specifically, the present invention relates to an electronic part module and a process for manufacturing the same, wherein a thermoplastic resin is used as the substrate of the circuit board.

BACKGROUND ART

Heretofore, in a thin card with a built-in IC chip, for example, an IC card, various IC chip modules in which connection terminals of an IC chip is connected to a connection pattern of a circuit board are utilized. In this type of IC chip modules, the IC card itself is not so expensive. Accordingly, since the IC chip modules must be manufactured as cheap as possible, a single-sided board having a connection pattern formed on one side of the circuit board is utilized and the IC chip is generally bonded and fixed on another side of the single-sided board. Various processes for bonding and fixing the IC chip to the circuit board and for electrically connecting connection terminals of the IC chip and the connection pattern of the circuit board have been proposed.

In a conventional IC chip module, referring to FIG. 7 through FIG. 9, a process for bonding and fixing an IC chip and a circuit board, and a process for electrically connecting connection terminals of an IC chip and a connection pattern of a circuit board will be explained.

FIG. 7 is a side view showing one example of a conventional IC chip module. The IC chip module 100 utilizes a board made from a thermosetting resin as a substrate 101. An IC chip 106 is bonded to the substrate 101 by an adhesive 105. In order to electrically connect connection terminals of the IC chip 106 and a connection pattern 103, after exposing the connection pattern 103 by forming connection holes 107 in the substrate 101 of the circuit board 104, the connection terminals of the IC chip 106 and the connection pattern 103 are electrically connected via wires 108.

FIG. 8 is a side view showing another example of a conventional IC chip module. The IC chip module 110 utilizes a board made from a thermosetting resin as a substrate 111. In order to electrically connect connection terminals of the IC chip 116 and a connection pattern 113, after exposing the connection pattern 113 by forming connection holes 117 in the substrate 111 of the circuit board 114, solder bumps B and the connection pattern 113 are electrically connected by solder in the connection holes 117. In order to bond the IC chip 116 to the substrate 111, an adhesive 115 is applied to a periphery of the IC chip 116 after the solder bumps B and the connection pattern 113 are electrically connected as described above.

Further, FIG. 9 is a side view showing the other example of a conventional IC chip module. The IC chip module 120 utilizes a board made from a thermosetting resin as a substrate 121. In order to electrically connect connection terminals of an IC chip 126 and a connection pattern 123, and in order to bond the IC chip 126 to the substrate 121, the connection pattern 123 is exposed by forming connection holes 127 in the substrate 121 of the circuit board 124. After electric conductive paste 128 is applied in the connection holes 127, bumps B are positioned and the electric conductive paste 128 is thermoset. Accordingly, the bumps B and the connecting pattern 113 are electrically connected. Then, the IC chip 126 is bonded to the circuit board 124 by applying a thermosetting adhesive 125 to a periphery of the IC chip 126 and by thermosetting the adhesive 125.

However, in each of the above described conventional IC chip modules 100, 110, 120, a thermosetting resin such as a glass-epoxy resin is utilized as a substrate 101, 111, 121 of the circuit board 104, 114, 124. Generally, the thermosetting resin is expensive. Accordingly, the problem arises in that the costs of the IC chip modules 100, 110, 120 is increased.

Further, in order to connect the connection terminals of the IC chips 106, 116, 126 and the connection patterns 103, 113, 123, the connection holes 107, 117, 127 must be formed in the substrate 101, 111, 121. Accordingly, the processes for manufacturing the conventional IC chip modules 100, 110, 120 become complicated and the costs are increased because a connection hole forming process is required.

Furthermore, in order to bond and fix the IC chips 106, 116, 126 onto the circuit boards 104, 114, 124, adhesives 105, 115, 125 are additionally required. Accordingly, the costs of the IC chip modules 100, 110, 120 are increased in accordance with the amount of the adhesives 105, 115, 125.

The present invention has been made in order to solve the above described prior problems. An object of the present invention is to provide an inexpensive electronic part module and a process for manufacturing the same wherein an inexpensive thermoplastic resin is used as the substrate of the circuit board, the connection holes need not be formed in the substrate when the bumps of the electronic part such as an IC chip and the like are electrically connected to the connection pattern, and the substrate itself is utilized as an adhesive.

DISCLOSURE OF THE INVENTION

To achieve the object, an electronic part module according to claims 1 and 2 includes the following: a circuit board having a substrate formed from a thermoplastic resin, and a connection pattern provided on one surface of the substrate; an electronic part such as an IC chip and the like provided with a bump; the bump being passed through the substrate and connected to the connection pattern with pressure; and the electronic part being bonded to the substrate at least at a periphery of the bump through the substrate which is hardened after melted.

In the electronic part module including the above-mentioned structure according to claims 1 and 2, since a substrate of a circuit board is formed from a thermoplastic resin which is generally cheaper than a thermosetting resin, the cost of an electronic part module can be suppressed at a low level by reducing the cost of the substrate. Further, since a solder bump is passed through the substrate by pressing the electronic part from a side of another surface of the substrate in a state that the electronic part is heated to a temperature higher than a melting point of the thermoplastic resin and lower than a melting point of the solder bump, a connecting hole is not necessary in order to connect the bump and the connection pattern. Accordingly, it is possible to reduce a cost for manufacturing the electronic part module. Furthermore, since the electronic part is bonded to the substrate at least at a periphery of the bump through the thermoplastic resin of the substrate which is hardened after melted upon heating, an adhesive is not necessary when the electronic part is bonded to the substrate. Accordingly, in this point, it is also possible to reduce the cost of the electronic part module.

Further, an electronic part module according to claim 3 has a structure that, in the electronic part module according to claim 1 or claim 2, an anchoring surface is formed on a connection pattern's one side which contacts with the substrate and the bump is connected to the connection pattern via the anchoring surface. In the electronic part module according to claim 3, anchoring processing is performed on a copper foil's surface which is bonded to the substrate which is a base for forming a connection pattern. It becomes possible that the reliability of the electrical connection between the bump and the connection pattern is improved because it is skillfully utilized that anchoring processing is performed on the copper foil's surface which is bonded to the substrate and because the bump is passed through the substrate and connected to the connection pattern's surface on which the anchoring processing has been performed.

Further, a process for manufacturing an electronic part module according to claim 4 includes the steps of heating an electronic part such as an IC chip and the like which is provided with a bump to a temperature higher than a melting point of a thermoplastic resin and lower than a melting point of the bump; passing the bump through a substrate and connecting the bump to a connection pattern with pressure by pressing the electronic part heated in the heating step from a side of another surface of a circuit board having the connection pattern provided on one surface of the substrate made from the thermoplastic resin; heating the electronic part to a temperature higher than the melting point of the bump; and bonding the electronic part to the substrate at a periphery of the solder bump via the thermoplastic resin of the substrate hardened by cooling the electronic part and the circuit board after the thermoplastic resin is melted. By performing these steps, the electronic part module according to claim 1 can be manufactured.

EXPLANATION OF REFERENCES

Figure 1:
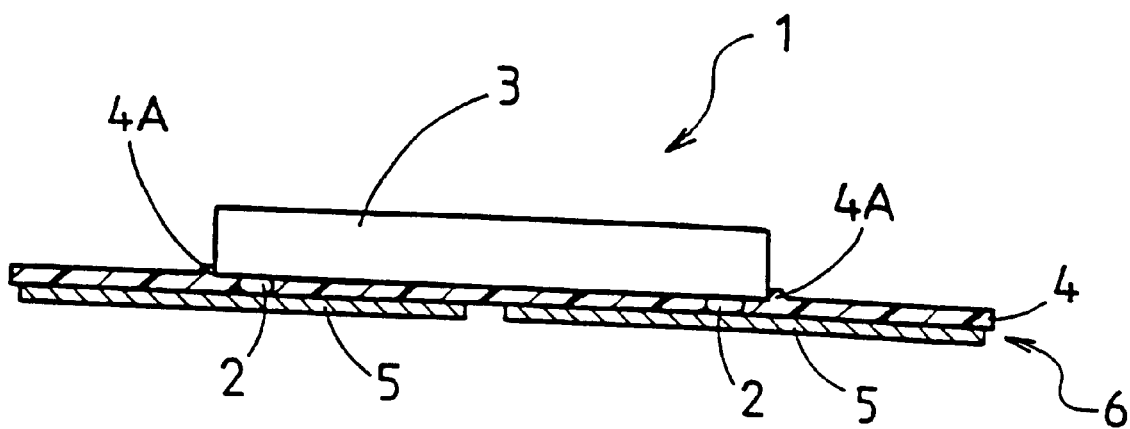
FIG. 1 is a side sectional view of an electronic part module according to a first embodiment.

1 . . . IC chip module
2 . . . Solder bump
3 . . . IC chip
4 . . . Substrate
4A . . . Protrusive portion
5 . . . Connection pattern
5A . . . Anchoring surface
6 . . . Circuit board
10 . . . Fixed head
11 . . . Suction hole
12 . . . Heating head
A . . . Head press temperature
B . . . Connection temperature
C . . . Head up temperature
b . . . Connection time

BEST MODES OF CARRYING OUT THE INVENTION

Hereinafter, an electronic part module and the process for manufacturing the same according to the present invention will be specifically described with reference to the drawings.

First, an IC chip module according to a first embodiment is explained with reference to FIG. 1 and FIG. 2. FIG. 1 is a side sectional view of the IC chip module according to the first embodiment and FIG. 2 is an enlarged explanatory illustration of a connection part between a solder bump and a connection pattern.

In FIG. 1, the IC chip module 1 basically includes an IC chip 3 and a circuit board 6. The IC chip 3 has solder bumps 2 formed on a lower surface of the IC chip 3. The circuit board 6 includes a substrate 4 formed from a thermoplastic resin. A connection pattern 5 is provided on one surface (a lower surface) of the substrate 4, and the IC chip 3 is mounted on an upper surface of the substrate 4.

Here, the solder bumps 2 are consisted of so-called 6:4 solder whose melting point is 183° C. The substrate 4 is formed from a thermoplastic copolymer polyester resin (a hot melt ink adhesive produced by TOA Synthetic Chemical, Inc.: Alon Melt PES-111EE) whose melting point is 105° C. As the substrate 4, other thermoplastic resins, for example, polyether imide, polyphenylene sulfide, polybutadiene, polyethylene, polyethylene sulfide, polyurethane, polystyrene and the like, which show both thermoplasticity at around 100° C. and adhesion after hardened are applicable. Further, the connection pattern 5 is formed as a desired pattern by an etching process after an anchoring processing surface of copper foil on which anchoring process has been performed entirely is bonded to the substrate 4.

Figure 2:
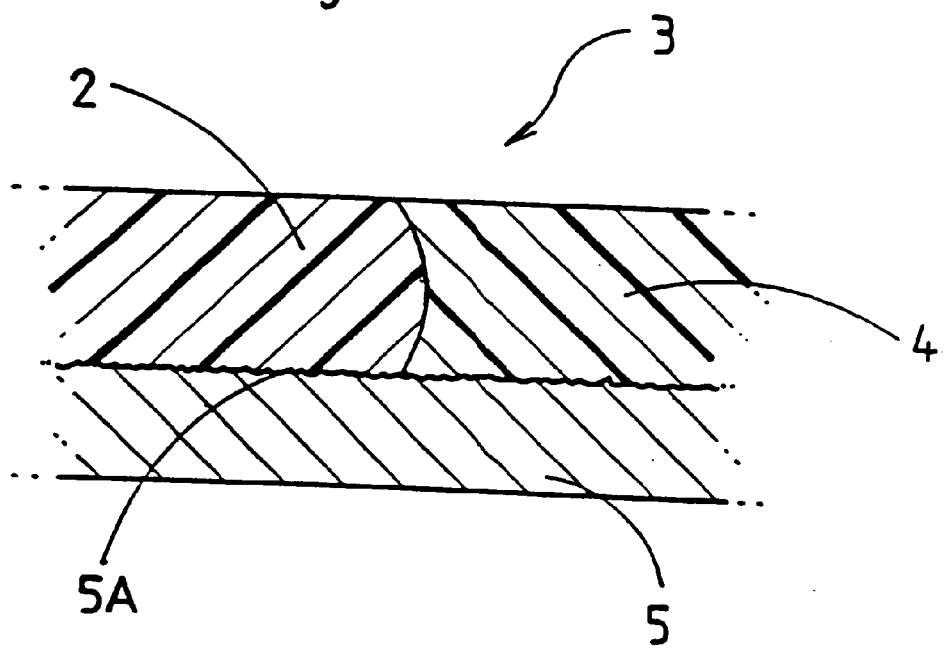
FIG. 2 is an enlarged explanatory illustration of a connection part between a solder bump and a connection pattern.

The solder bumps 2 on the lower surface of the IC chip 3 are passed through the substrate 4 from the surface of the substrate 4 (from an upper side) when the IC chip 3 is mounted on the circuit board 6, and, as shown in FIG. 2, are connected to the anchoring surface 5A of the connection pattern 5. The IC chip 3 is bonded to the substrate 4 at peripheries of the solder bumps 2 and at an entire back surface of the IC chip 3 by hardening the thermoplastic resin of the substrate 4 after melted. The thermoplastic resin of the substrate 4 hardened after melted forms protrusive portion 4A around the IC chip 3. As described hereinafter, the solder bumps 2 are passed through the substrate 4 by pressing the IC chip 3 to the substrate 4 in the state that the IC chip 3 is heated to a temperature higher than the melting point of the thermoplastic resin and lower than the melting point of the solder bumps 2, and connected to the connection pattern. Further, the solder bumps 2 can be more firmly connected to the connection pattern 5 by heating the IC chip 3 higher than the melting point of the solder bumps 2 after the solder bumps 2 are passed through the substrate 4. The detailed process for manufacturing the IC chip module 1 will be explained hereinafter.

As described above, since the substrate 4 is formed from a thermoplastic resin which is much cheaper than a thermosetting resin which has been used as a substrate of a circuit board of a conventional IC chip module, the cost of the IC chip module 1 can be suppressed at a low level by reducing the cost of the substrate 4. Further, the IC chip 3 is bonded to the substrate 4 by the thermoplastic resin of the substrate 4 which is melted around the solder bumps 2 and over the entire back surface of the IC chip 3 by the heated IC chip 3 when the IC chip 3 is mounted on the circuit board 6, and then which is hardened. Accordingly, since an adhesive is not necessary when the IC chip 3 is mounted, the cost of the IC chip module 1 can be reduced. Especially, since the IC chip 3 is bonded at peripheries of the solder bumps 2 and over the entire back surface of the IC chip 3, the bonding strength between the IC chip 3 and the circuit board 6 can be increased and the IC chip 3 can be firmly bonded to the circuit board 6. Furthermore, since the solder bumps 2 are connected to the anchoring surface SA of the connection pattern 5, the reliability of the electrical connection between the solder bumps 2 and the connection pattern 5 can be improved by skillfully utilizing the copper foil having a surface which is bonded to the substrate and on which anchoring process is performed.

Figure 3:
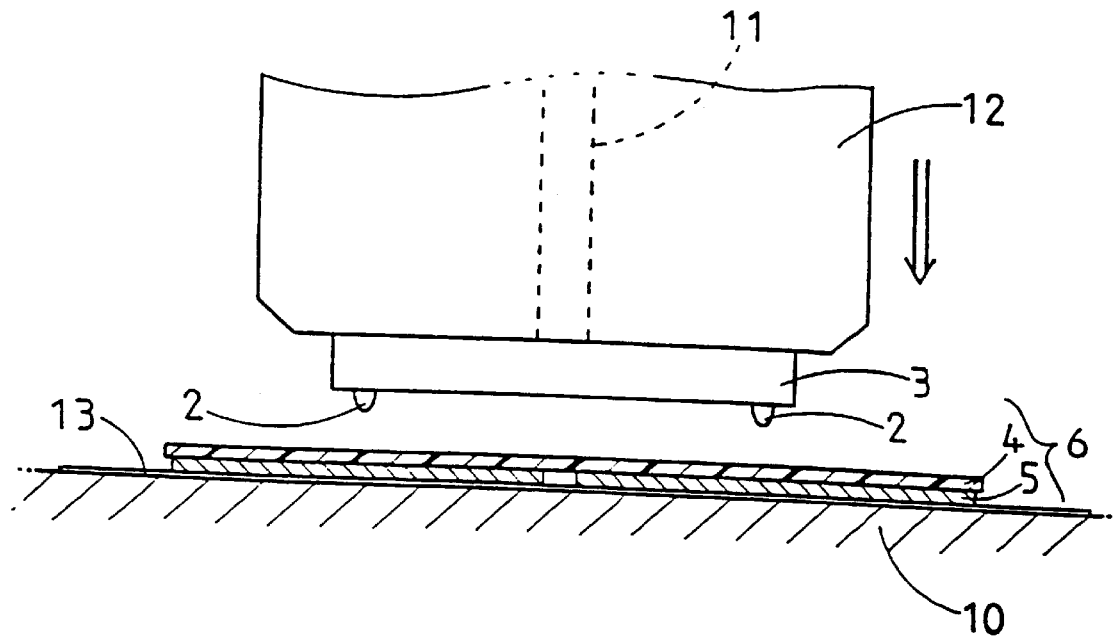
FIG. 3 is an illustrational side view showing a state before the electronic part is pressed to the circuit board via a heating head.
Figure 4:
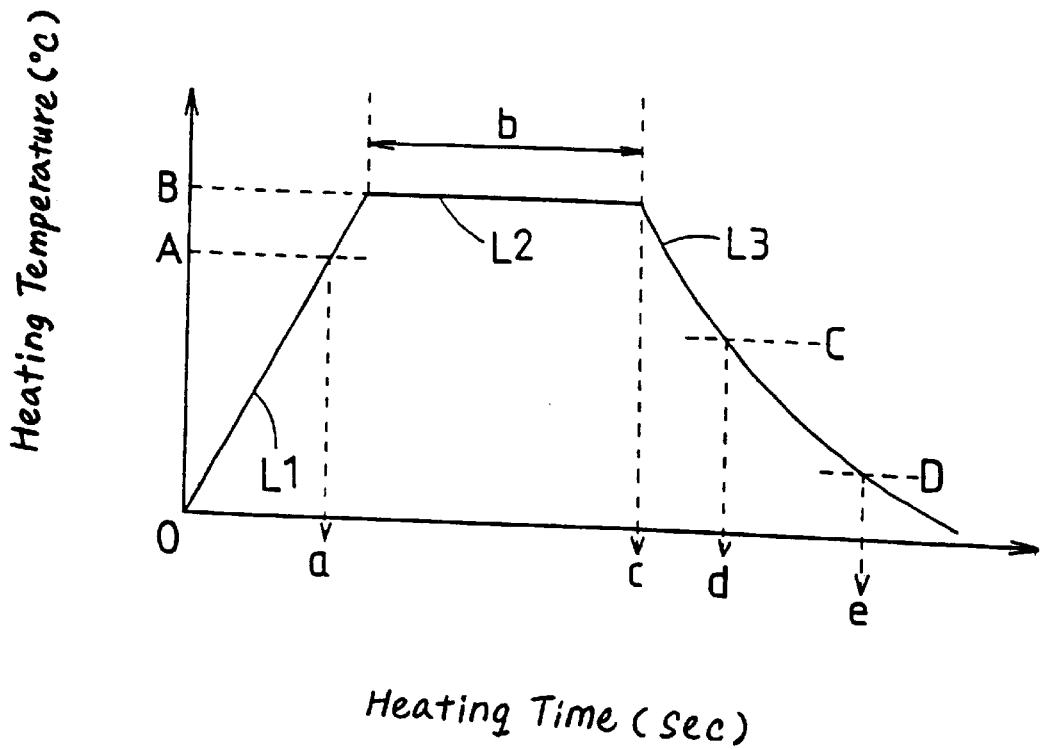
FIG. 4 is a graph showing a relationship between a heating temperature of the heating head and heating time when the heating head is controlled.

Next, the process for manufacturing the IC chip module 1 constructed as described above will be explained with reference to FIG. 3 through FIG. 5. First, a heating head 12 is moved to a chip sucking stage. After the IC chip 3 is retained at a lower surface of the heating head 12 via a suction hole 11 by being sucked by a suction apparatus, the heating head 12 is positioned above the circuit board 6 at a chip mounting stage. This state is shown in FIG. 3.

Figure 5:
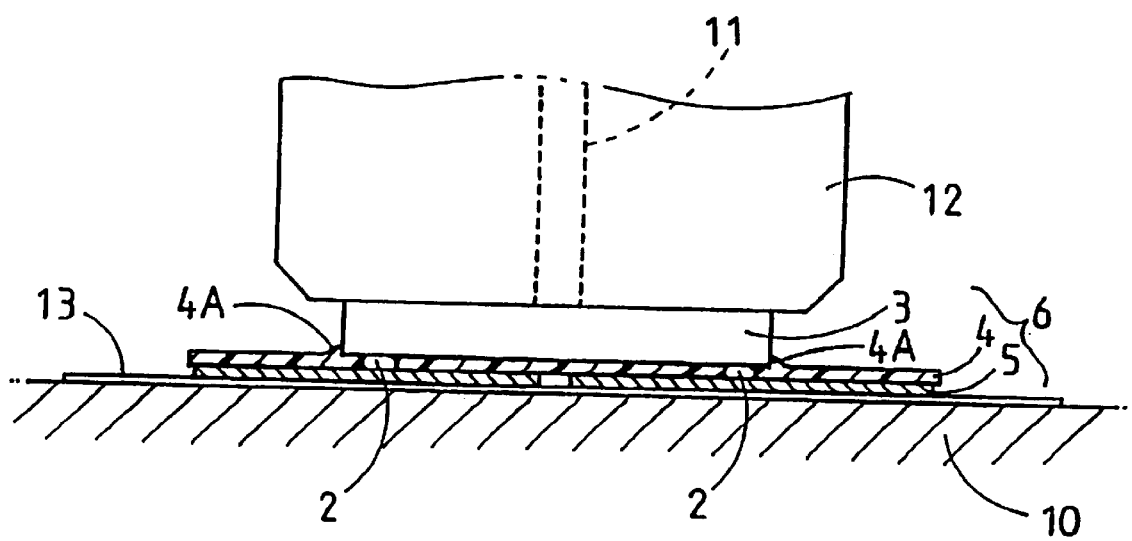
FIG. 5 is an illustrational side view showing a state in which the electronic part is pressed to the circuit board via a heating head.

Next, the heating head 12 is moved downwardly and stopped when the lower ends of the solder bumps 2 touch the upper surface of the substrate 4 which is provided on a fixed head 10 via a sheet 13. Then, heating the heating head 12 is started by turning on a pulse heater. Thereby, the temperature of the heating head 12 is raised according to a straight line L1. The heating head 12 is moved downwardly when the temperature of the heating head 12 becomes a head press temperature A (150° C.), and the solder bumps 2 are passed through the substrate 4 with a predetermined pressure (4 kgf/cm$^2$). At this time, since the head press temperature A is higher than the melting point of the thermoplastic resin of the substrate 4, and lower than the melting point of the solder bumps 2, the substrate 4 is gradually softened and is in a state of melting. Accordingly, the solder bumps 2 retaining their shapes are passed through the substrate 4, and contacted with and connected to the connection pattern 5. This state is shown in FIG. 5.

The temperature of the heating head 12 is further raised along the straight line L1 and reaches a connection temperature B (240° C.). The state in which the temperature of the heating head 12 is kept at the connection temperature B is continued during a connection time b. Here, since the connection temperature B is higher than the melting point of the solder bumps 2, the solder bumps 2 are gradually melted while contacted with the connection pattern 5 as described above, and connected to the connection pattern 5 by being pressed and deformed during the connection time b. At this point, the thermoplastic resin of the substrate 4 is in a state that the thermoplastic resin is melted around the peripheries of the solder bumps 2 and over the entire back surface of the IC chip 3. Heating the heating head 12 is stopped on the basis of a time-up signal c output when the connection time b elapses, and cooling the heating head 12 is started. When the heating head 12 is cooled down along a curved line L3 and the temperature of the heating head 12 becomes a head up temperature C, a head up signal d is output. On the basis of the head up signal d, the action of sucking the IC chip 3 is stopped and the heating head 12 is moved upwardly. At this point, the thermoplastic resin of the substrate 4 around the peripheries of the solder bumps 2 and over the entire lower surface of the IC chip 3 is gradually hardened, and thus the IC chip 3 is bonded through the thermoplastic resin at the protrusive portion 4A formed around the solder bumps 2 and at the entire lower surface of the IC chip 3. Accordingly, the IC chip 3 can be bonded and fixed to the circuit board 6 without an adhesive. Then, when the temperature of the heating head 12 becomes a predetermined temperature D (lower than 50° C.), an ending signal e is output and the mounting of the IC chip 3 is completed. By performing this mounting action, the IC chip module 1 which has been explained with reference to FIG. 1 and FIG. 2 can be manufactured.

Figure 6:
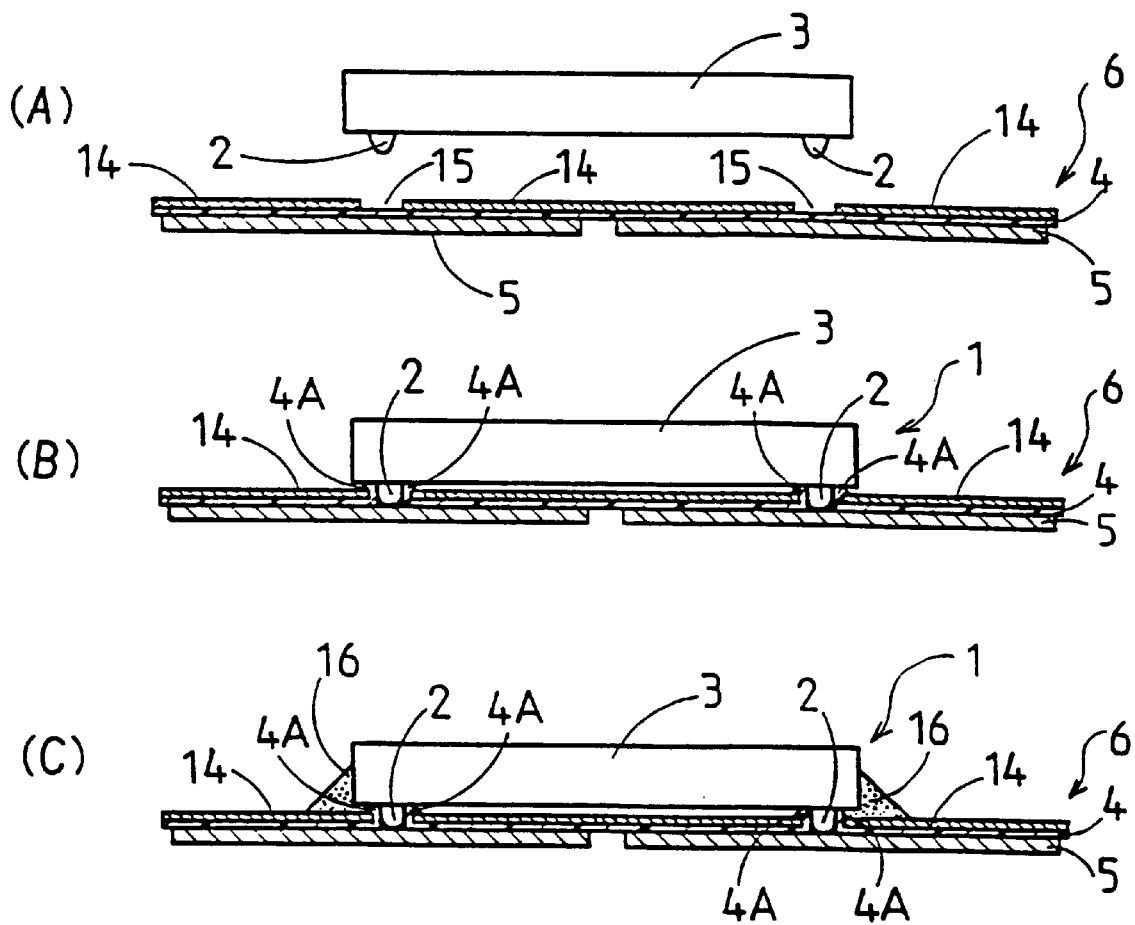
FIG. 6 is an explanatory illustration showing manufacturing processes of an electronic part module according to a second embodiment.
Figure 7:
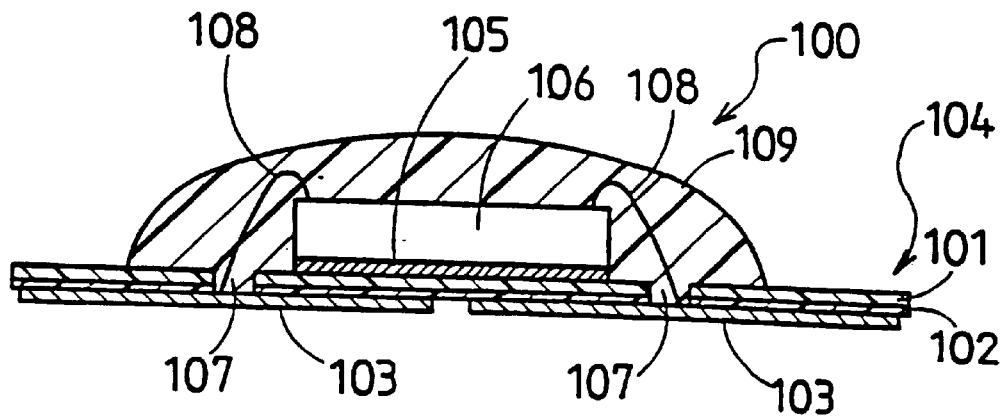
FIG. 7 is a side view of one example of a conventional IC chip module.
Figure 8:
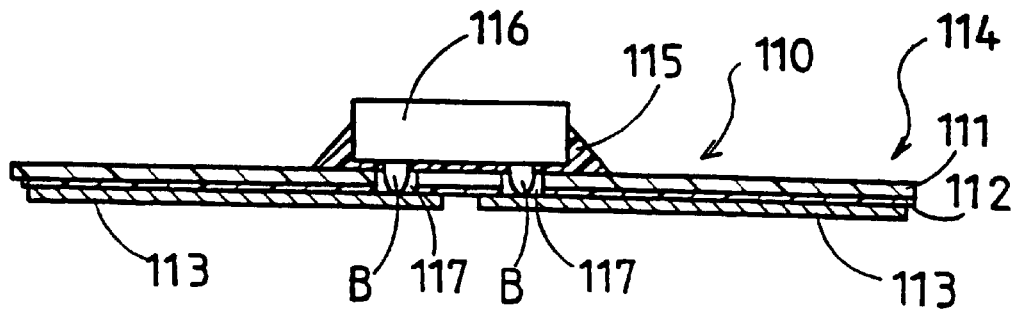
FIG. 8 is a side view of another example of a conventional IC chip module.
Figure 9:
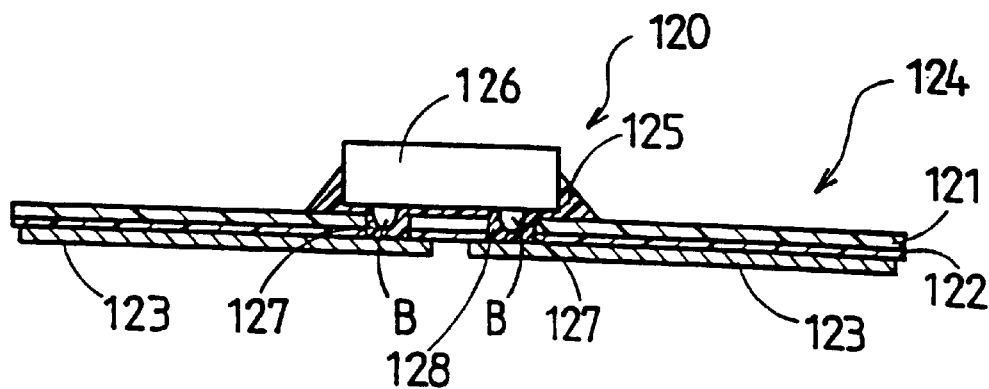
FIG. 9 is a side view of further another example of a conventional IC chip module.

Next, the IC chip module according to a second embodiment will be explained with reference to FIG. 6. FIG. 6 is an explanatory illustration showing a manufacturing process of the IC chip module according to the second embodiment. Note that this IC chip module is manufactured by the same apparatus as the mounting apparatus which is used for manufacturing the IC chip module 1 according to the first embodiment. Accordingly, the mounting apparatus is omitted in FIG. 6. Although the IC chip module according to the second embodiment basically has a similar structure to that of the IC chip module 1 according to the first embodiment, the IC chip module according to the second embodiment differs only in the point that a photosensitive resin film 14 in which positioning holes 15 are provided in order to position the solder bumps 2 on the substrate 4 of the circuit board 6 is formed. Accordingly, in this embodiment, the same elements and the like will be explained by giving the same reference numerals, and the explanation will be focused on the different points.

In FIG. 6(A), a circuit board 6 includes a substrate 4 formed from a thermoplastic resin, and a connection pattern 5 provided on one surface (a lower surface) of the substrate 4. On the substrate 4, the photosensitive resin film 14 is formed. In the photosensitive resin film 14, positioning holes 15 are formed corresponding to the connection pattern 5 in order to position the solder bumps 2 of the IC chip 3. The photosensitive resin film 14 acts to protect the substrate 4 from a hydrolysis because the thermoplastic resin is easily hydrolyzed since the substrate 4 is formed from a thermoplastic resin.

To manufacture the IC chip module 1, first, the solder bumps 2 of the IC chip 3 and the positioning holes 15 of the photosensitive resin film 14 are positioned such that the solder bumps 2 and the positioning holes 15 face each other. This state is shown in FIG. 6(A). Next, the temperature control similar to that in the first embodiment is performed, and the IC chip 3 is bonded through the thermoplastic resin at the protrusive portions 4A formed around the solder bumps 2. Accordingly, the IC chip 3 can be bonded and fixed to the circuit board 6 without an adhesive. The IC chip module 1 is manufactured in this way. This state is shown in FIG. 6(B).

In the IC chip module 1 according to the second embodiment, although the IC chip 3 is bonded and fixed to the circuit board 6 via the thermoplastic resin of the substrate 4 at the peripheries of the solder bumps 2, the IC chip 3 may be bonded and fixed to the circuit board 6 via the photo cured resin 16 at the periphery of the IC chip 3 as shown in FIG. 6(C) in order to improve the bonding strength between the IC chip 3 and the circuit board 6.

The invention is not limited to the embodiments described above, and it is apparent that numerous improvements and modifications can be made thereto within the scope not departing from the concept of the invention. For example, although the heating temperature of the heating head 12 is controlled in the first embodiment the temperature of the fixed head 10 may be controlled.

INDUSTRIAL APPLICABILITY

As explained above, the present invention can provide a low cost electronic part module and a process for manufacturing the same, wherein an inexpensive thermoplastic resin is used as a substrate of a circuit board, and wherein the bumps of the electronic part, for example, an IC chip and the like, is passed through the substrate without forming connection holes in the substrate and the substrate itself can be used as an adhesive when the bumps are electrically connected to the connection pattern.

What is claimed is:

1. An electronic part module comprising:
   a circuit board including
      a substrate formed from a thermoplastic resin and having opposite first and second surfaces; and
      a connection pattern formed on the first surface of said substrate;
   an electronic part provided with at least one bump;
   said at least one bump being passed through said substrate from the second surface to the first surface by heating the substrate and pressing the at least one bump to the substrate, and being connected to said connection pattern with pressure; and
   said electronic part being bonded to the second surface of said substrate at least at a periphery of said at least one bump through said substrate which is hardened after melted.

2. An electronic part module according to claim 1, wherein an anchoring surface is formed on a side of said connection pattern, said side of said connection pattern contacting with said substrate, and wherein said at least one bump is connected to said connection pattern via said anchoring surface.

3. An electronic part module according to claim 1, wherein said at least one bump is thermally deformed when said at least one bump is connected to said connection pattern.

4. An electronic part module according to claim 3, wherein an anchoring surface is formed on a side of said connection pattern, said side of said connection pattern contacting with said substrate, and wherein said at least one bump is connected to said connection pattern via said anchoring surface.

* * * * *